United States Patent
Kim et al.

(10) Patent No.: US 7,871,872 B2
(45) Date of Patent: Jan. 18, 2011

(54) METHOD OF MANUFACTURING THIN FILM TRANSISTOR HAVING LIGHTLY DOPED DRAIN REGIONS

(75) Inventors: Jong-man Kim, Yongin-si (KR); Kyung-bae Park, Yongin-si (KR); Jang-yeon Kwon, Yongin-si (KR); Ji-sim Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 550 days.

(21) Appl. No.: 11/876,650

(22) Filed: Oct. 22, 2007

(65) Prior Publication Data

US 2008/0145981 A1    Jun. 19, 2008

(30) Foreign Application Priority Data

Dec. 18, 2006    (KR) .................. 10-2006-0129656

(51) Int. Cl.
   *H01L 21/84*    (2006.01)
(52) U.S. Cl. .................. 438/163; 438/149; 438/151
(58) Field of Classification Search .................. 438/149, 438/151, 163
   See application file for complete search history.

(56) References Cited

U.S. PATENT DOCUMENTS

| | | | |
|---|---|---|---|
| 7,470,579 B2 * | 12/2008 | Lim et al. | 438/197 |
| 2003/0201435 A1 * | 10/2003 | Suzawa | 257/59 |
| 2005/0064665 A1 * | 3/2005 | Han | 438/286 |

* cited by examiner

*Primary Examiner*—David Vu
*Assistant Examiner*—Suberr Chi
(74) *Attorney, Agent, or Firm*—Cantor Colburn LLP

(57) ABSTRACT

Provided is a method of manufacturing a thin film transistor, the method comprising: forming an amorphous silicon layer on a substrate; forming a polysilicon layer by crystallizing the amorphous silicon layer; forming a mask structure that masks a portion of the polysilicon; forming a source and a drain region and a channel region interposed between the source and the drain regions in the polysilicon layer; injecting impurities having a first concentration using an ion beam implantation into one end and the other end of the polysilicon layer which are not covered by the mask structure. The ends of the polysilicon layer with the mask thereon is then subjected to ion bombardment to increase the level of impurities in the source and drain regions while at the same time shrinking the size of the masked regions.

13 Claims, 9 Drawing Sheets

0KeV, 0mA

40KeV, 1mA

40KeV, 2mA

40KeV, 3mA

40KeV, 5mA

40KeV, 6mA

US 7,871,872 B2

METHOD OF MANUFACTURING THIN FILM TRANSISTOR HAVING LIGHTLY DOPED DRAIN REGIONS

CROSS-REFERENCE TO RELATED PATENT APPLICATION

This application claims priority to Korean Patent Application No. 10-2006-0129656, filed on Dec. 18, 2006, in the Korean Intellectual Property Office, and all the benefits accruing therefrom under 35 U.S.C. §119, the disclosure of which is incorporated herein in its entirety by reference.

BACKGROUND OF THE INVENTION

1. Field of the Invention

The present invention relates to a method of manufacturing a thin film transistor, and more particularly, to a method of manufacturing a thin film transistor having a structure in which a lightly doped drain (LDD) region is formed between a source/drain region and a channel region.

2. Description of the Related Art

Thin film transistors (TFT) are used as switching devices in flat panel displays such as organic light emitting displays (OLEDs) or liquid crystal displays (LCDs). A TFT usually includes a semiconductor layer, a gate electrode, and source and drain electrodes, and the semiconductor layer includes source/drain regions and a channel region interposed between the source region and the drain region. The semiconductor layer can be formed of polysilicon or amorphous silicon. Polysilicon is generally used to form semiconductor layers because the electron mobility of the polysilicon is higher than that of the amorphous silicon and thus the semiconductor layer formed of polysilicon is advantageous for high speed operation of devices.

On the other hand, polysilicon thin film transistors have a greater off current than amorphous silicon thin film transistors. To address this problem associated with polysilicon TFTs, a structure in which lightly doped drain (LDD) regions are formed between source/drain regions and a channel region has been suggested. The LDD regions can prevent a rapid increase in the electric current of an electric field between the channel region and the source/drain region. As a result, the off current of TFTs can be lowered and a hot carrier effect (HCE), which appears as the length of a channel of TFTs decreases, can be suppressed, thereby increasing the reliability of the channel. However, in conventional TFT manufacturing processes the photomask process and the etching process are performed separately to form the LDD regions, thereby increasing the number of manufacturing processes and manufacturing costs. Moreover, the interface property of the source/drain region can undergo deterioration when the photomask process and etching process are performed separately.

SUMMARY OF THE INVENTION

The present invention provides a method of manufacturing a thin film transistor (TFT) having a structure in which lightly doped regions are formed between source/drain regions and a channel region.

According to one embodiment, there is provided a method of manufacturing a thin film transistor, the method comprising: forming an amorphous silicon layer on a substrate; forming a polysilicon layer by crystallizing the amorphous silicon layer; forming an insulation layer on the polysilicon layer; forming a mask structure masking a portion of the polysilicon layer, wherein the mask structure comprises a gate mask and a photoresist layer which are sequentially deposited on the insulation layer; forming a source and a drain region and a channel region interposed between the source and the drain regions in the polysilicon layer by injecting impurities having a first concentration using an ion beam implantation process into one end portion and other end portion of the polysilicon layer which are not covered by the mask structure; exposing the one end portion and the other end portion of the gate mask by shrinking the photoresist layer by shooting an ion beam to the photoresist layer; forming a gate electrode and a gate insulation layer having the same width as the shrunk photoresist layer by etching the gate mask and the insulation layer using the shrunk photoresist layer as an etch mask; and forming lightly doped drain (LDD) regions by injecting impurities having a second concentration lower than the first concentration into one end portion of the channel region which is exposed between the gate insulation layer and the source region and the other end portion of the channel region which is exposed between the gate insulation layer and the drain region using an ion beam implantation process.

The ion beam implantation process for injecting the impurities having the first concentration and the ion beam shooting process for the photoresist layer can be performed concurrently in one process.

BRIEF DESCRIPTION OF THE DRAWINGS

The above and other features and advantages will become more apparent by describing in detail exemplary embodiments thereof with reference to the attached drawings in which.

DETAILED DESCRIPTION OF THE INVENTION

The terminology used herein is for the purpose of describing particular embodiments only and is not intended to be limiting of the invention. The terms "a" and "an" do not denote a limitation of quantity, but rather denote the presence of at least one of the referenced item. The term "or" means "and/or". The terms "comprising", "having", "including", and "containing" are to be construed as open-ended terms (i.e., meaning "including, but not limited to").

Recitation of ranges of values are merely intended to serve as a shorthand method of referring individually to each separate value falling within the range, unless otherwise indicated herein, and each separate value is incorporated into the specification as if it were individually recited herein. The endpoints of all ranges are included within the range and independently combinable.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein. Unless defined otherwise, technical and scientific terms used herein have the same meaning as is commonly understood by one of skill in the art to which this invention belongs.

The present invention will now be described more fully with reference to the accompanying drawings, in which exemplary embodiments of the invention are shown. The thickness of layers or regions illustrated in the schematic diagrams are exaggerated for better understanding of the present invention.

Figure 1:
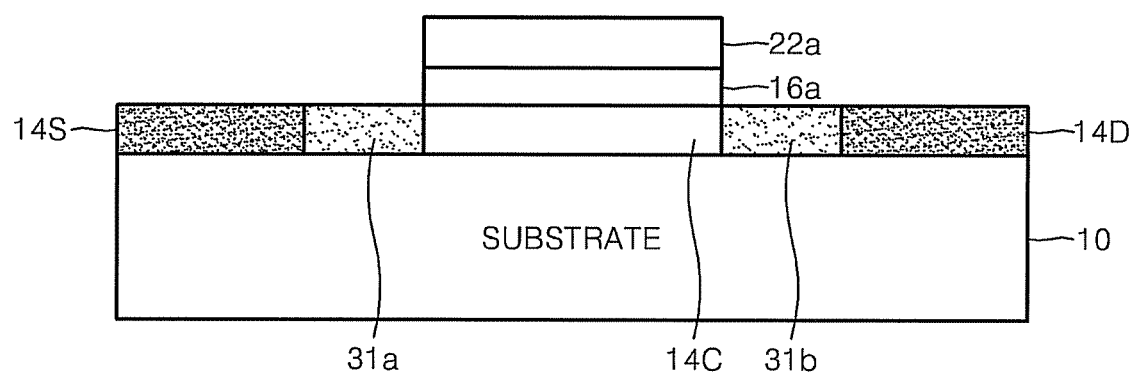
FIG. 1 is an exemplary schematic diagram illustrating a cross-sectional view of a thin film transistor (TFT) manufactured according to an embodiment.

FIG. 1 is an exemplary schematic diagram illustrating a cross-sectional view of a thin film transistor (TFT) manufactured according to an embodiment of the present invention. FIGS. 2A through 2J are schematic diagrams, which illustrate a method of manufacturing a TFT according to an embodiment of the present invention.

Referring to FIG. 1, the TFT comprises source/drain regions 14S and 14D, a channel region 14C interposed between the source and the drain regions, lightly doped drain (LDD) regions 31a and 31b interposed between the source/drain regions 14S and 14D and the channel region 14C, and a gate insulation layer 16a and a gate electrode 22a which are sequentially deposited on the channel region 14C. The source/drain regions 14S and 14D, channel region 14C, and LLD regions 31a and 31b are formed on substrate 10. The substrate 10 can be formed of plastic, glass, or quartz.

Since the LDD regions 31a and 31b are conventionally used in TFT devices, detailed descriptions thereof will be omitted herein. The LDD regions 31a and 31b can prevent a rapid increase in an electric field between the channel region 14C and the source/drain regions 14S and 14D. As a result, the off current of the TFT can be lowered and a hot carrier effect (HCE), which appears as the length of the channel region of the TFT decreases, can be suppressed, thereby increasing the reliability of the channel region 14C.

FIGS. 2A through 2J illustrate a method of manufacturing a TFT according to an embodiment of the present invention. Each material layer can be formed by vapor deposition methods such as a physical vapor deposition (PVD), plasma enhanced chemical vapor deposition (PECVD), or a chemical vapor deposition (CVD), which are generally used in semiconductor manufacturing processes.

Figure 2A:
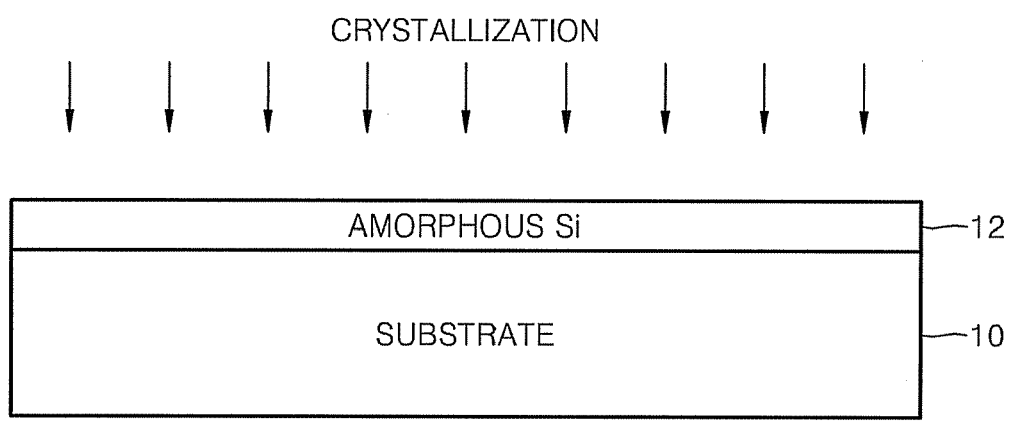
FIGS. 2A through 2J are exemplary schematic diagrams illustrating a method of manufacturing a TFT according to an embodiment.
Figure 2B:
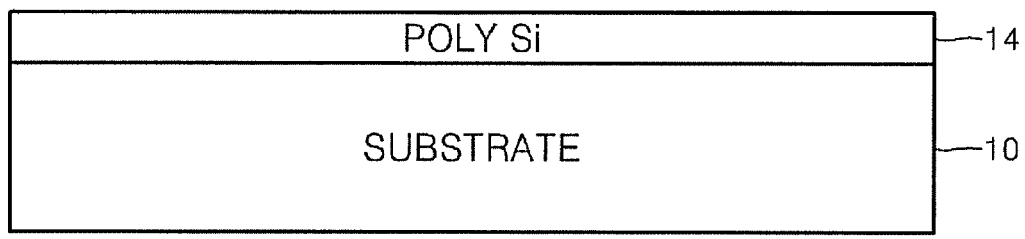
Figure 2C:
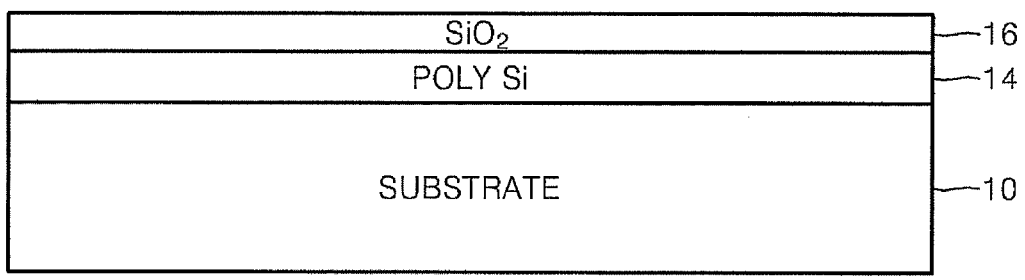

Referring to FIGS. 2A through 2C, an amorphous silicon layer 12 is formed on a substrate 10 with a thickness of approximately 500 Å and then a polysilicon layer 14 is formed by crystallizing the amorphous silicon layer 12. The crystallization of the amorphous silicon layer 12 can be performed by laser annealing, such as, for example, using an Excimer laser or a YAG laser, or by furnace annealing. Specifically, the crystallization process of the amorphous silicon layer 12 can be performed by irradiating the amorphous silicon layer 12 with a 308 nm XeCl Excimer laser having an energy density of about 150 to about 300 mJ/cm$^2$ about 1 to about 10 times over. The substrate 10 can be formed of plastic, glass, or quartz.

Next, an insulation layer 16 is formed of SiN or SiO$_2$ with a thickness of approximately 1000 Å on the polysilicon layer 14.

Figure 2D:
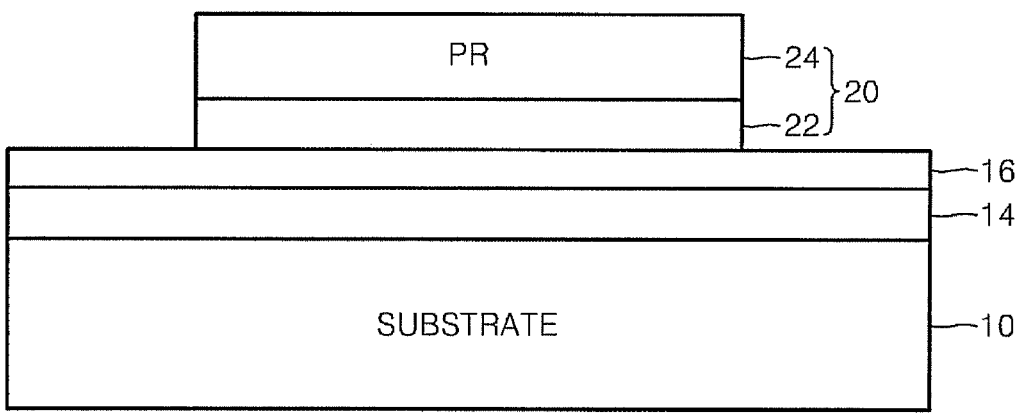
Figure 2E:
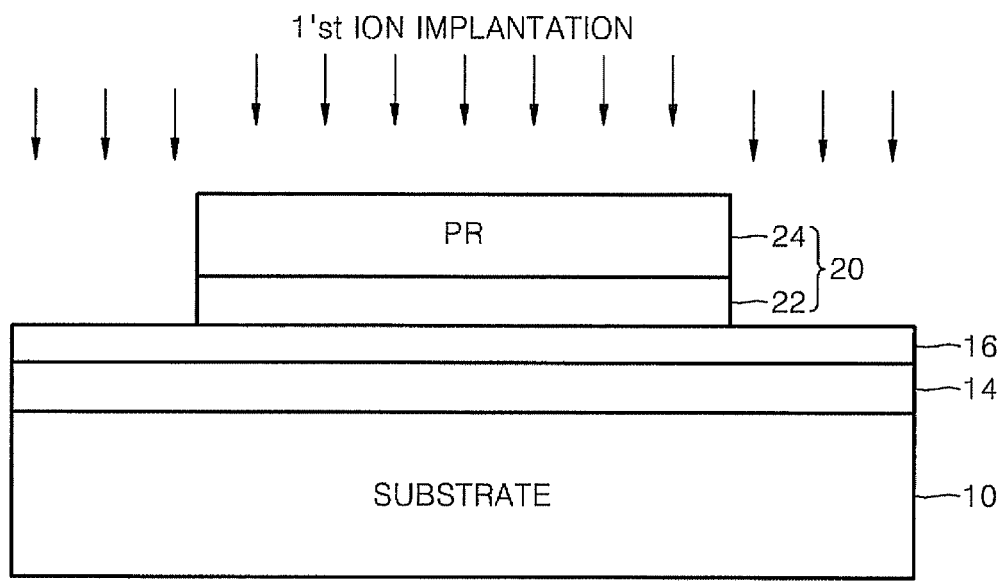
Figure 2F:
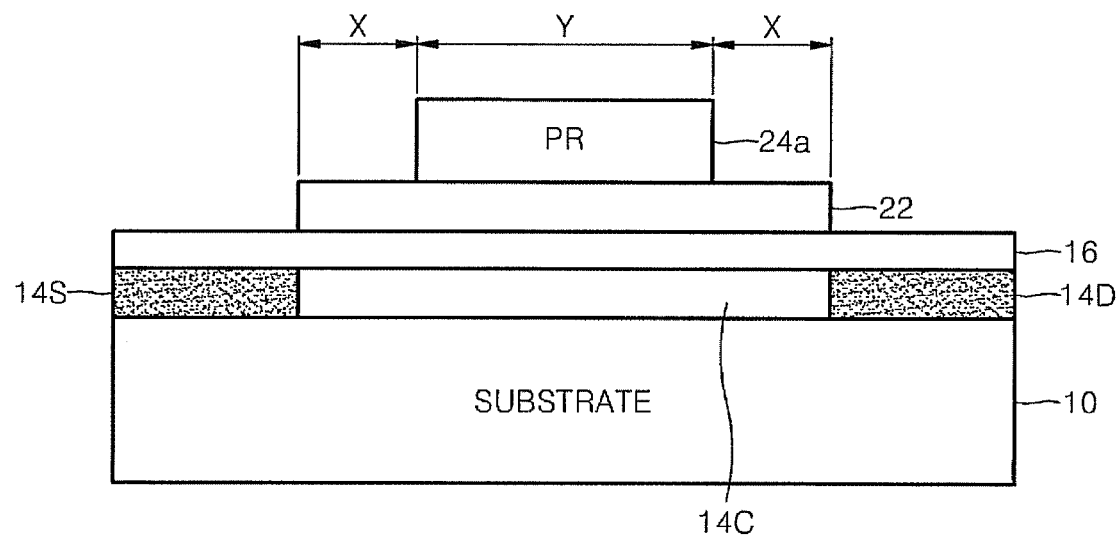

Referring to FIGS. 2D through 2F, a mask structure 20 masking a portion of the polysilicon layer 14, more specifically masking a center portion of the polysilicon layer 14, is formed on the insulation layer 16. The mask structure 20 comprises a gate mask 22 and a photoresist layer (PR) 24 deposited sequentially on the insulation layer. The gate mask 22 can be temporarily used as an impurity doping mask in subsequent processes, however, it is used eventually as a gate electrode in the TFT of the present invention. In one embodiment, the gate electrode is in intimate contact with the insulation layer 16. The gate mask 22 is formed of a metal material selected from Ni, Al, Nd, Pt, Au, Co, Ir, Cr or Mo, or an alloy thereof. For example, the gate mask 22 can be formed of AlNd with a thickness of approximately 2000 Å.

Next, source/drain regions 14S and 14D and a channel region 14C interposed between the source/drain regions 14S and 14D can be formed on the polysilicon layer 14 by injecting impurities of a first concentration using an ion beam implantation process in one end portion and in the other end portion of the polysilicon layer 14. In particular, the ion beam implantation process injects impurities into one end portion and in the other end portion of the polysilicon layer 14 which are not covered by the mask structure 20. When the ion beam is accelerated by high voltage energy, each impurity ion in the ion beam can tunnel the SiO$_2$ insulation layer 16 and dope the polysilicon layer 14. The channel region 14C may be formed to a length of about 10 to about 20 μm.

N-type or p-type dopants can be used as impurities for forming the source/drain regions 14S and 14D. The source/drain regions 14S and 14D may be formed to have a sheet resistance of about 100 to about 2000 ohms/square (Ω/sq), wherein a first concentration of the impurities can be controlled in a range from about $1E^{14}$ to about $1E^{15}$ ions/cm$^2$.

As can be seen in the FIG. 2F, the size of the photoresist layer 24 is reduced (i.e., shrunk) to a width Y by using the ion beam to degrade the photoresist layer 24. Degrading the photoresist layer 24 with the ion beam can be conducted in conjunction with the ion implantation process utilized to dope polysilicon layer 14 with impurities, or in a separate subsequent process. Thus, the ion beam implantation process for injecting the impurities of the first concentration and the ion beam degradation process to shrink the photoresist layer 24 may be performed concurrently in one process. As used herein, X refers to a shrinkage length of one end portion or the other end portion of the photoresist layer 24 following treatment with the ion beam. As used herein, Y refers to a width of the photoresist layer 24a after shrinkage. The total shrinkage length of the photoresist layer 24 following treatment with the ion beam can be referred to as 2X (or X+X) because each shrinkage length of the one end portion and the other end portion should be added. The width of the photoresist layer 24 before shrinkage can be referred to as 2X+Y. Throughout the present application, including FIGS. 3A through 3F and FIG. 4, the shrinkage length X of the photoresist layer 24 refers only to the shrinkage length of one end or the other end, not to the total shrinkage length.

When the ion beam is used to bombard the photoresist layer 24, a shrinkage phenomenon can occur because of inner energy change due to the ion bombardment. The shrinkage length X of the photoresist layer 24a can be controlled by adjusting the ion beam current. Specifically, the ion beam current can be controlled to about 1 to about 6 mA. The shrinkage length X of the photoresist layer 24a is proportionate to the increase of the ion beam current and can be controlled to provide a shrinkage length X of about 0.1 to about 10 μm, when the accelerating energy of the ion beam is controlled to about 10 to about 1000 KeV. The shrunk photoresist layer 24a can be used as a useful etch mask in a subsequent etching process.

Figure 2G:
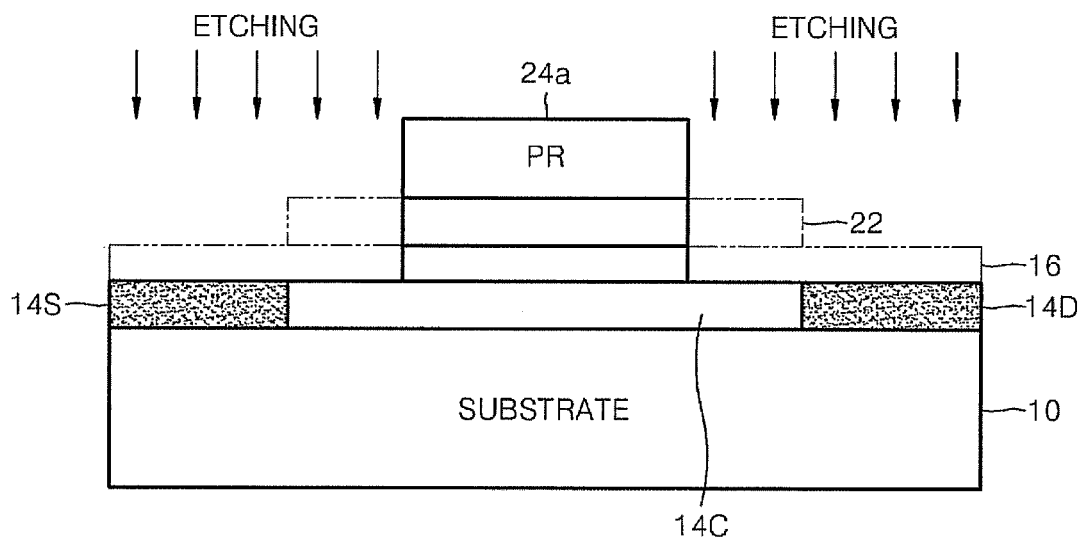
Figure 2H:
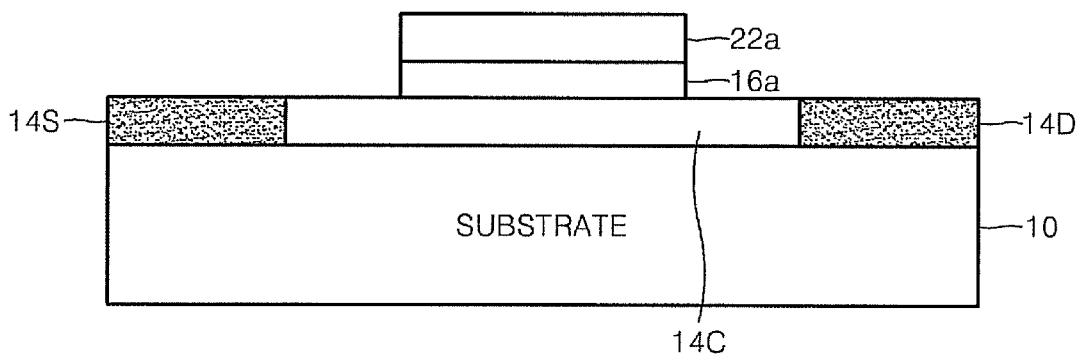

Referring to FIGS. 2G through 2H, using the shrunk photoresist layer 24a as an etch mask, the gate electrode 22a and the gate insulation layer 16a are formed by etching respectively the gate mask 22 and the insulation layer 16 to the same width Y as the shrunk photoresist layer 24a. Next, the photoresist layer 24a is removed. As a result of the etching process, both ends of the channel region 14C can be exposed and opened. Specifically, one end portion and the other end portion of the channel region 14C can be exposed between the gate insulation layer 16a and the source region 14S and between the gate insulation layer 16a and the drain region 14D.

Figure 2I:
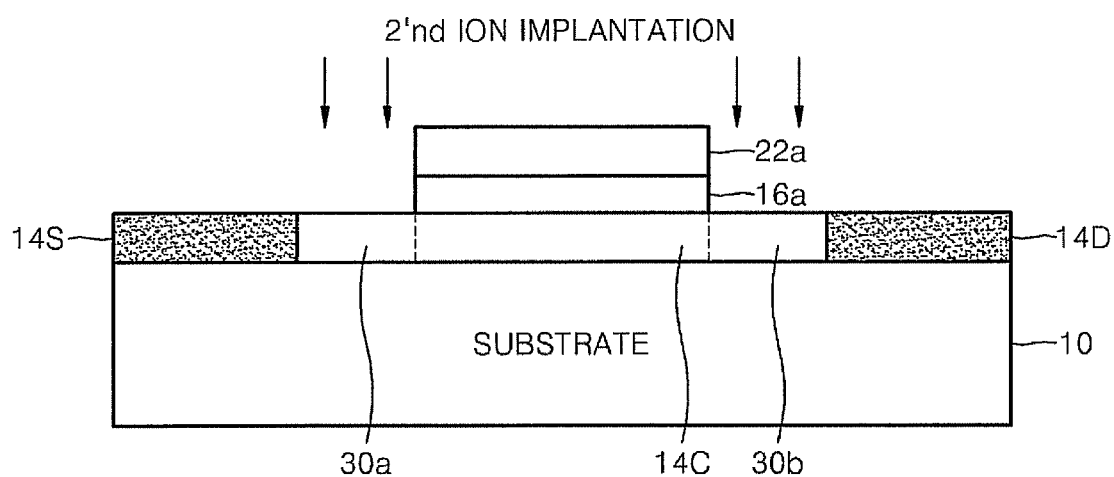
Figure 2J:
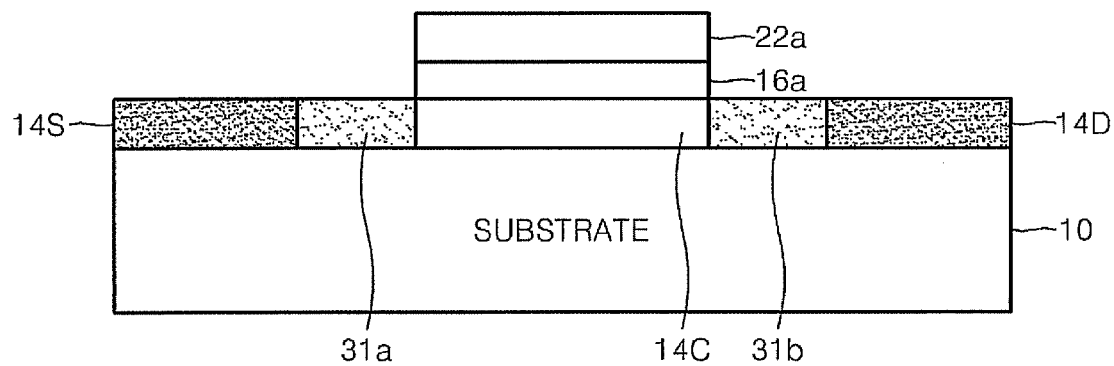
Figure 3A:
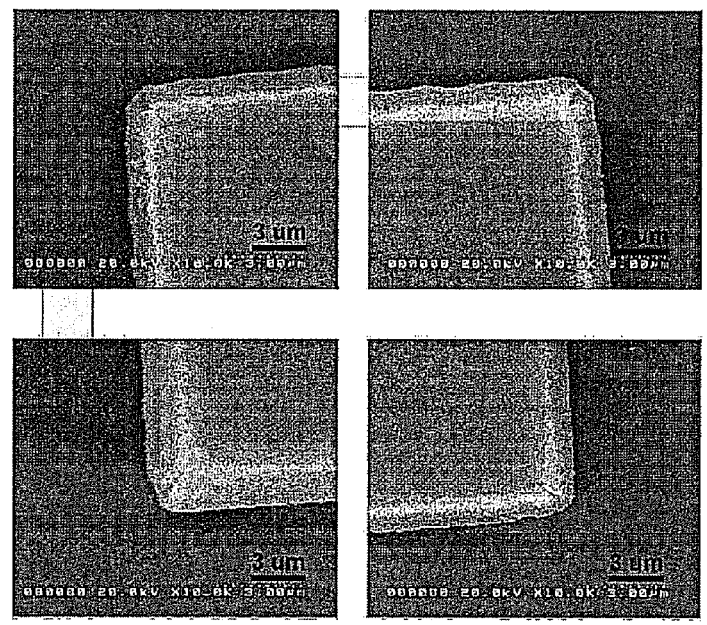
FIGS. 3A through 3F are SEM images showing the change in shrinking length of photoresist layers according to the change in ion beam current utilized in a manufacturing process according to an embodiment.
Figure 3B:
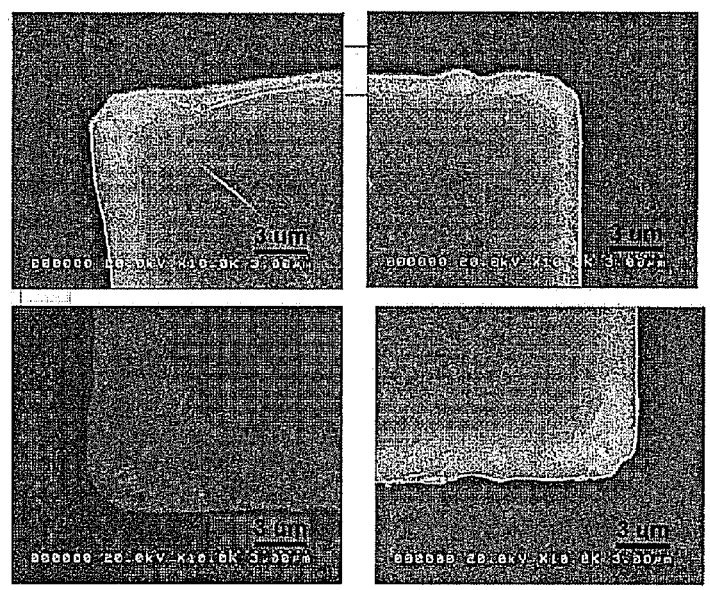
Figure 3C:
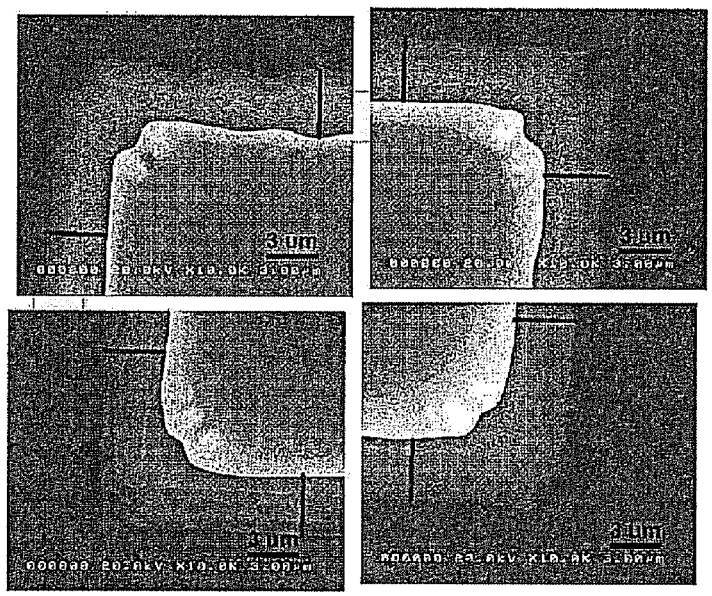
Figure 3D:
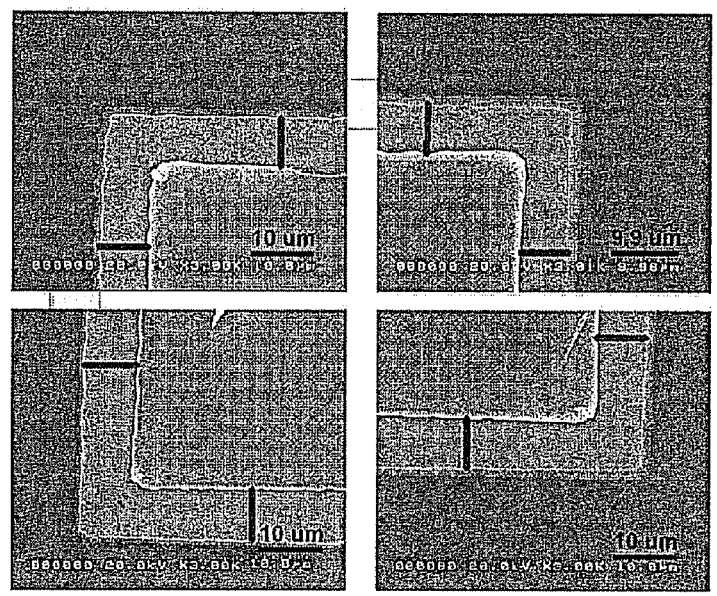
Figure 3E:
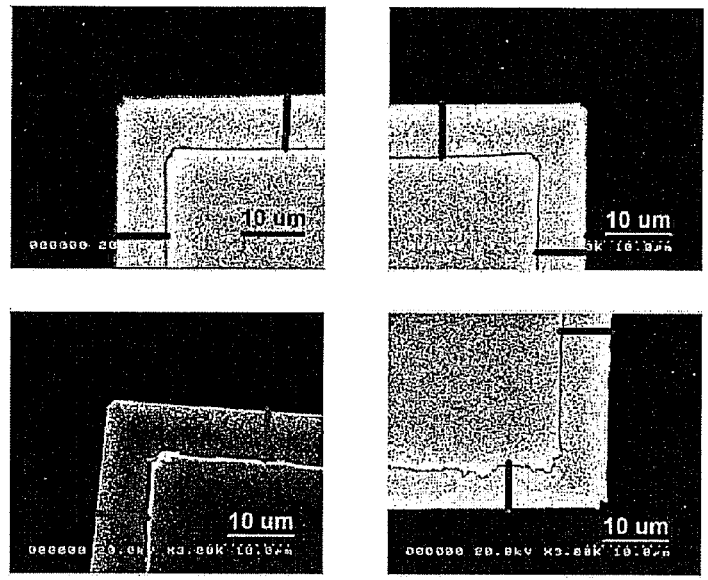
Figure 3F:
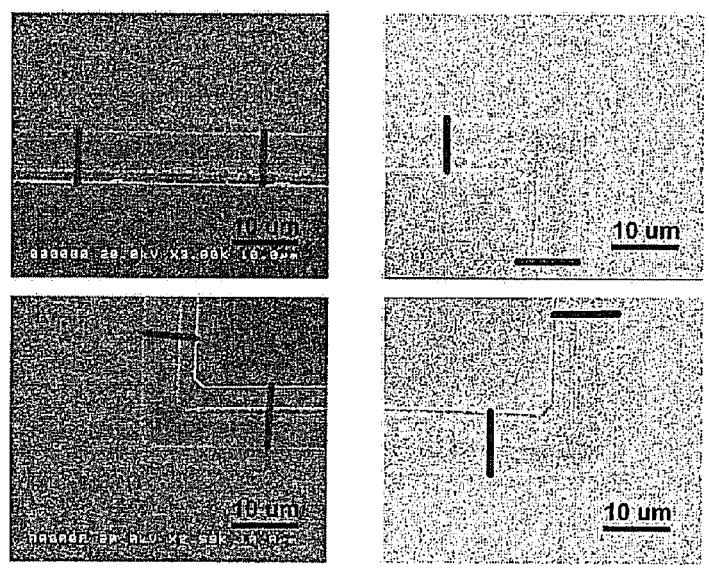

Referring to FIGS. 2I and 2J, after the formation of the gate electrode 22a and the gate insulation layer 16a, the LDD regions 31a and 31b interposed between the source and the channel region and between the drain region the channel region can be formed by injecting impurities having a second concentration lower than the first concentration to the exposed one end and the other end of the channel region 14C using the ion beam implantation method. N-type or p-type dopants can be used as the impurities for forming the LDD regions 31a and 31b. The LDD regions 31a and 31b can be formed to have a sheet resistance of about 5000 to about 10000 $\Omega$/sq, wherein the second concentration of the impurities can be controlled in the range of about $1E^{12}$ to about $1E^{13}$ ions/cm$^2$. The width of the LDD regions 31a and 31b, which are respectively formed in the one end portion and the other end portion of the channel region 14C, can be controlled to provide a LDD width of 1 μm to about 7 μm for each of LDD regions 31a and 31b.

The TFT comprising the structure in which the LDD regions are formed between the source/drain regions and the channel region can be manufactured by the manufacturing process of the present invention. Since separate photomask process and etching process should be performed to form the LDD regions in the conventional TFT manufacturing processes, the number of manufacturing processes and the costs can increase. Moreover, the interface property of the source/drain regions can deteriorate during the separate photomask process and etching process. However, the performance of the TFT devices can be improved as well as the number of manufacturing processes and costs can be reduced according to the present invention.

Figure 4:
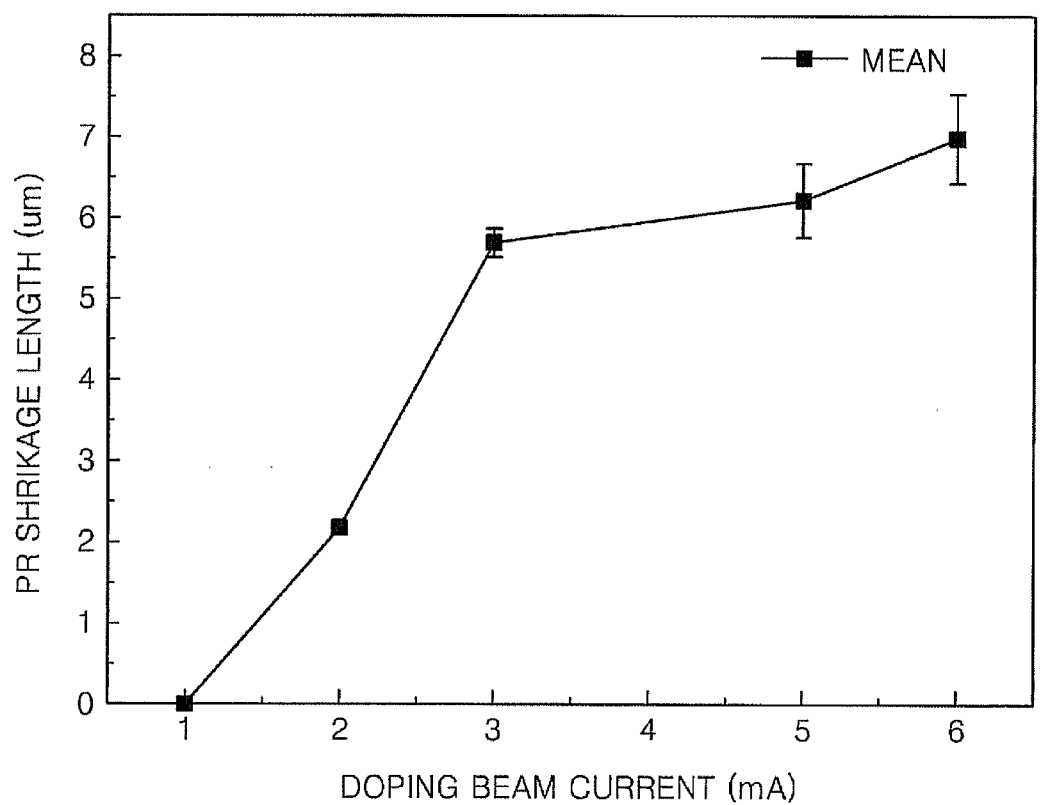
FIG. 4 is a graph showing the change in shrinking length of photoresist layers according to the change in ion beam current in a manufacturing process according to an embodiment.

FIGS. 3A through 3F are SEM images showing changes in the shrinkage length of the photoresist layer relative to changes of ion beam current in manufacturing processes according to the embodiments of the present invention. FIG. 4 is a graph illustrating the changes in shrinkage length of the photoresist layer relative to the changes of the ion beam current shown in FIG. 3A through 3F.

For FIGS. 3A through 3F, the shrinkage length X of the photoresist (PR) layer is measured while the accelerating energy of ion beam is maintained to 40 KeV, and the ion beam current is 1, 2, 3, 4, 5 and 6 mA, respectively. Four pictures are shown in each of FIGS. 3A through 3F, and the four pictures respectively show the shrinkage length X measured in four different positions selected from borders of the photoresist layer. The average value of the shrinkage length X measured in the four different positions is drawn as the graph of FIG. 4. Referring to FIG. 4, the shrinkage length X of the photoresist (PR) layer increases from 0 μm to about 7 μm as the ion beam current increases from 1 mA to about 6 mA.

In one embodiment, the invention provides a TFT having a structure in which LDD regions are formed between source/drain regions and a channel region manufactured by a cost effective process that reduces the number of manufacturing processes and cost, as compared to conventional methods. The LDD regions can prevent a rapid increase of electric current between the channel region and the source/drain regions, thereby lowering the off current of the TFT and thus ensuring reliability of the channel region.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a thin film transistor, the method comprising:
   forming an amorphous silicon layer on a substrate;
   forming a polysilicon layer by crystallizing the amorphous silicon layer;
   forming an insulation layer on the polysilicon layer;
   forming a mask structure masking a portion of the polysilicon layer, wherein the mask structure comprises a gate mask and a photoresist layer which are sequentially deposited on the insulation layer;
   forming a source region and a drain region and a channel region interposed therebetween by injecting impurities having a first concentration using an ion beam implantation process into both end portions of the polysilicon layer which are not covered by the mask structure;
   exposing both end portions of the gate mask by shrinking the photoresist layer by shooting an ion beam to the photoresist layer using an ion beam implantation process;
   forming a gate electrode and a gate insulation layer having the same width as the shrunk photoresist layer by etching the gate mask and the insulation layer using the shrunk photoresist layer as an etch mask; and
   forming lightly doped drain (LDD) regions by injecting impurities having a second concentration lower than the first concentration using an ion beam implantation process into both end portions of the channel region which is exposed by the gate electrode and the gate insulation layer,
   wherein the forming of the source region and the drain region is performed prior to the exposing of the both end portions of the gate mask.

2. The method of claim 1, wherein the ion beam implantation process for injecting the impurities having the first concentration and the process of shooting the ion beam to the photoresist layer are performed concurrently in one process.

3. The method of claim 2, wherein the ion beam implantation process uses an ion beam having an accelerating energy of about 10 to about 1000 KeV.

4. The method of claim 2, wherein a shrinkage length of the photoresist layer is controlled by adjusting an ion beam current of the ion beam implantation process.

5. The method of claim 4, wherein the ion beam current is about 1 to about 6 mA.

6. The method of claim 5, wherein the shrinkage length is controlled to about 0.1 to about 10 μm.

7. The method of claim 6, wherein each width of the LDD regions is about 1 to about 7 μm, respectively.

8. The method of claim 1, wherein the first concentration is in the range of about 1E14 to about 1E15 ions/cm$^2$.

9. The method of claim 8, wherein the second concentration is in the range of about 1E12 to about 1E13 ions/cm$^2$.

10. The method of claim 1, wherein the source region and drain region are formed to have a sheet resistance of about 100 to about 2000 Ω/sq.

11. The method of claim 10, wherein the LDD regions are formed to have a sheet resistance of about 5000 to about 10000 Ω/sq.

12. The method of claim 1, wherein the impurities having the first concentration and the second concentration are n-type or p-type impurities.

13. The method of claim 1, wherein the gate mask is formed of metal material.

* * * * *